United States Patent [19]

Kuusinen

[11] Patent Number: 5,745,503
[45] Date of Patent: Apr. 28, 1998

[54] ERROR CORRECTION DECODER THAT OPERATES IN EITHER ARDS SYSTEM OR A RBDS SYSTEM

[75] Inventor: Tero Kuusinen, Turku, Finland

[73] Assignee: Nokia Mobile Phones Ltd., Salo, Finland

[21] Appl. No.: 419,918

[22] Filed: Apr. 11, 1995

[51] Int. Cl.⁶ .................................................. H23M 13/00
[52] U.S. Cl. ........................... 371/37.1; 371/41; 375/340
[58] Field of Search .............................. 375/340, 357, 375/354; 455/33.1, 31.1, 38.1, 38.4; 371/11.1, 39.1, 41, 42, 46, 47.1, 49.2, 54, 72, 2.1, 37.7, 37.8, 37.1

[56] References Cited

U.S. PATENT DOCUMENTS

| | | | |
|---|---|---|---|
| 5,157,669 | 10/1992 | Yu et al. | 371/37.7 |
| 5,173,925 | 12/1992 | Mizoguchi | 375/14 |
| 5,325,372 | 6/1994 | Ish-Shalom | 371/37.6 |
| 5,396,653 | 3/1995 | Kivari et al. | 455/88 |
| 5,430,740 | 7/1995 | Kivari et al. | 371/37.1 |

OTHER PUBLICATIONS

Specification of the Radio Data System, published in Apr. 1992 by the European Telecommunications Standardization Institute (ETSI), Section B.2.2.

*Primary Examiner*—Wellington Chin
*Assistant Examiner*—William Luther
*Attorney, Agent, or Firm*—Perman & Green, LLP

[57] ABSTRACT

A decoding method and circuit takes into consideration two different techniques of using offset words in error correction coding by subtracting the offset word in a parallel mode from a calculated syndrome. In an error correction decoder (36) an entire incoming data block (26 bits, where 16 are data and 10 are parity) is read into a polynomial divider (11). The invention enables a single data receiver (30) to operate using error correction offset, words A, B, C, and D, in a first radio data system, or the offset words A, B, C, D, and E, in a second radio data system. In accordance with an error correction decoder of this invention the decoder is arranged with a parallel-bit output offset counter (13), an offset word generator (16), and a syndrome storage register (15) coupled to the polynomial divider (11) for enabling the subtracting of an offset word, in parallel, from calculated syndromes.

13 Claims, 3 Drawing Sheets

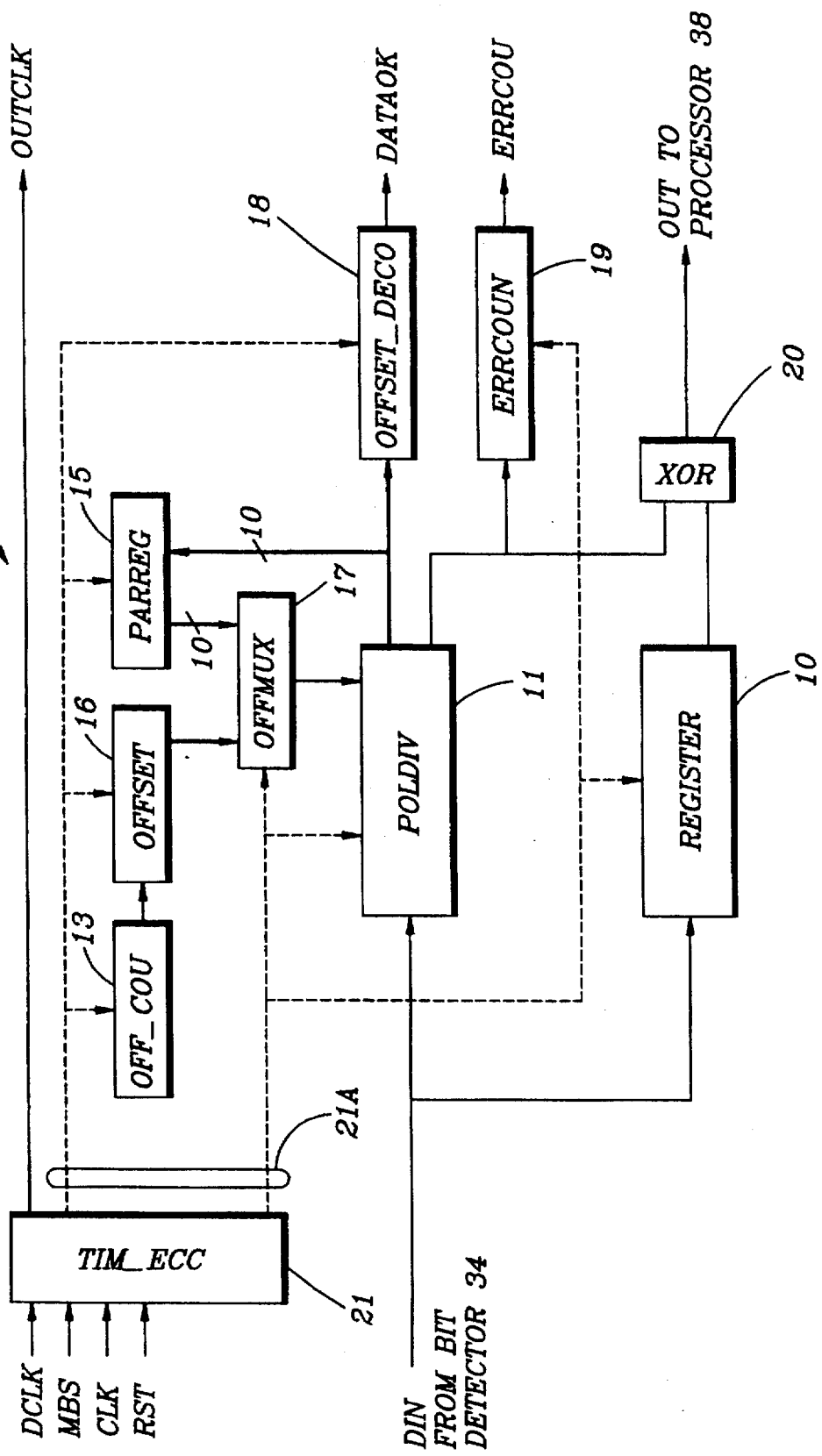

ERROR CORRECTION DECODER THAT OPERATES IN EITHER ARDS SYSTEM OR A RBDS SYSTEM

FIELD OF THE INVENTION

This invention relates to radio receivers capable of receiving digital information and, in particular, to error correction decoding methods and error correction decoders used in such receivers.

BACKGROUND OF THE INVENTION

The Radio Data System (RDS) and Radio Band Data System (RBDS) are wireless telecommunications systems wherein additional information in the form of a 57 kHz superimposed carrier (1178.5 Hz baud rate, BPSK modulated) is implemented on a frequency modulated (FM) radio carrier. This additional information provides a capability of sending, in addition to normal radio transmissions (e.g., voice in a mobile radiotelephone), data in the same transmission. For example, the information may help the receiver to automatically tune to the frequency on which the strongest signal is received. The information may also include specifics of the transmitting station, whereby the receiver may, on its display, indicate the identity of the transmitting station. Traffic-related information can also be sent using the 57 kHz superimposed carrier.

Moreover, since the RDS and RBDS systems provide a capability of sending additional information on the FM radio carrier, they also provide the possibility of sending paging messages over the FM radio frequencies. As such, the RDS and RBDS systems can be used as paging systems, and paging messages can be received by pagers designed to receive the RDS/RBDS data transmissions. The paging device receivers that receive the data (i.e., the 57 kHz superimposed carrier) transmitted on the FM frequencies can as well be implemented in FM radio receivers, whereby the FM receiver functions as both a radio and as a paging device. The RDS system is described in greater detail in the Specification of the Radio Data System, published in April 1992 by the European Telecommunications Standardization Institute (ETSI).

Different types of error control or correction codes (ECC) have been developed for and used in radio frequency transmission systems, such as mobile telephone systems and paging systems, to detect and correct errors which occur in transmission from a transmitter to a receiver. An error correction code is a code which, in the transmitter, is added to the signal to be sent and is thereafter tested in the receiver to determine if a transmission error has occurred. Some transmission errors can be corrected in the receiver, i.e., the error correction code provides for both the detection and the correction of transmission errors.

Error correction codes are usually implemented according to predetermined mathematical functions provided both in the transmitter, for coding, and in the receiver, for decoding. Many different error correction codes are known. Commonly used codes are so called bit codes, e.g., BCH code (Bose, Chaudhuri, Hocquenghem); block codes, e.g. Reed-Salomon code; and convolutional codes, e.g., a Trellis code. However, no one code is known that is optimum for all different types of transmission systems. Thus, a suitable error correction code is selected for each system separately according to system characteristics, e.g., depending on whether bits, bytes or words are being transmitted. Also, the ECC depends both on the amount and types of errors that are expected to occur in transmission. If many errors are expected to occur the ECC is implemented such that it is capable of detecting and correcting a large number of errors.

In RDS systems a bit code is specified for use as an error correction code. This bit code is typically a cyclic BCH code (26,16), meaning that one block to be sent includes a total of 26 bits, of which 16 bits are data bits (including the actual message to be sent) and the remaining 10 bits are parity bits which are used for error correction.

Reference is made to FIG. 1 for showing the general structure of an implementation of an RDS data block to be sent with an error correction code. The RDS transmission block 1 is formed from 16 data bits (2) which are to be sent, and from 10 parity bits (3) which are formulated on the basis of the data bits. First the parity bits 3 are calculated from the data bits 2 according to a predetermined mathematical function. The parity bits 3 are further modulo-two added with a 10-bit offset word to form the final parity bits 4 which are appended to the data bits to create a 26-bit RDS transmission block 1 (referred to as a (26, 16) transmission block, wherein there are a total of 26 bits, 16 of which are data bits). The function of modulo-two addition performs an exclusive-OR (XOR) function, with the inputs being the first formed ten parity bits 3 at one input of a XOR gate and the ten bits of a predetermined RDS offset word at a second input of the XOR gate. The offset words used for the RDS system are described in more detail below.

Next is provided a description of the error correction coding used in an RDS transmitter, as well as of the error correction decoder used in the RDS receiver. A detailed description of the error correction coding is provided in the above-mentioned Specification of the Radio Data System. The (26, 16) cyclic BCH bit code used in the RDS, and shown in FIG. 1, has been developed from a (341, 331) BCH code which contains a 331 data bit block and a 10 bit parity bit block. For the RDS the (341, 331) BCH code is reduced to the length (26, 16). This is done by setting the 315 first bits to '0' and by constructing the coder so that it knows that these first bits are always '0' and does therefore not need to transmit them. The error correction decoder used in the receiver is thus a (26, 16) decoder, even though the code is originally developed from a (341, 331) code.

The step of calculating the parity bits 3 shown in FIG. 1 can be performed according to the following generator polynomial:

$$g(x)=x^{10}+x^8+x^7+x^5+x^4+x^3+x^0;$$

in which x is the $m^{th}$ bit in order of the data bits (m being 0..15), where the exponent shows the order of the bit. This generator polynomial g(x) is the basis for the error correction code in the RDS and RBDS. The error correction code used in the RDS is based on the assumption that the transmission conditions are, on average, sufficiently good so that no errors will occur in transmission. However, if the transmission conditions become poor then it is difficult or impossible to create a stable data transmission through an RDS channel. The error correction code employed in the RDS is used in the receiver to detect and correct random errors which occur in the channel.

After the calculation of the parity bits with the generator polynomial g(x), the modulo-two addition with the offset word is performed. This addition operation facilitates synchronization to the incoming bit stream with the decoder, wherein the same generator polynomial g(x) and offset words are used as will be described below.

In the Specification of the Radio Data System four different offset words have been specified for error correction coding. These offset words are designated A, B, C, and D and have the following values:

A=0011111100,

B=0110011000,

C=0101101000, and

D=0110110100.

In the RDS these offset words are used for creating the parity bits 4 of FIG. 1 by performing the modulo-two addition with the offset words A, B, C, and D in such a manner that for successive transmission blocks 1 a different offset word is used. This is done by employing the different offset words A, B, C, and D in succession so that a sequence of the offset words is applied to the second input of the XOR gate for performing the modulo-two addition, the sequence being A,B,C,D,A,B,C,D,A,B,C,D . . .

In regard to the Specification of the Radio Data System, the error correction decoding function is now briefly explained with reference to FIG. 2, which shows a conventional error correction decoder as specified for use in the RDS. A more detailed circuit diagram is shown in the RDS specification. The procedure performed in the decoder is divided into two parts, namely block synchronization and error correction decoding.

For block synchronization the following steps (S) are performed.

Block Synchronization:

S1) Incoming bits 1 (see FIG. 1) are read into a data register 10a, which takes in 26 bits (and which, for example, can be implemented as a shift register).

S2) The bits fed into the data register 10a are also fed into a polynomial divider 11a (which in the specification has been also implemented as a shift register) in which the received data block (data word) is divided by the generator polynomial g(x). From this division the polynomial divider provides a syndrome as an output. The syndrome is checked to determine if the output of the polynomial divider 11a is equal to any of predetermined syndromes corresponding to the offset words A, B, C, or D. The syndromes have been specified in the Specification of the Radio Data System as $S_A$=1111011000 (syndrome corresponding to offset word A), $S_B$=1111010100, $S_C$=1001011100, and $S_D$=1001011000.

S3) If the output of the polynomial divider 11a is equal to any of the syndromes $S_A$ to $S_D$ then block synchronization has been achieved, otherwise a new bit is read into the data register 10a and the steps S2) and S3) are repeated until synchronization is achieved.

For error correction (EC) decoding the following steps are performed.

Error Correction Decoding:

EC1) A block of 26 bits is read into the error correction decoder shown in FIG. 2 so that the 16 first bits, i.e. the data bits, are read both into the data register 10a and into the polynomial divider 11a. Then the 10 parity bits are fed into the polynomial divider where they are divided by the generator polynomial g(x). A pre-multiplication may be done with the following polynomial:

$$r(x)=x^9+x^8+x^4+x^3+x^0.$$

Before the syndrome calculation is performed by the polynomial divider 11a the offset word appropriate to the block is subtracted from the parity bit word serially bit-by-bit with a modulo-two adder 12a, which preferably is implemented with an XOR gate. Since synchronization has been already been achieved, the decoder knows the correct offset word. The offset words are counted with an offset word counter 13a in order to keep track of which offset word is being used. For this purpose a conventional 2-bit counter may be used. When the modulo-two addition has been performed the remaining 10 bits (i.e. the parity bits) following the first 16 bits are read into the polynomial divider 11a.

EC2) The contents of the data register 10a are output bit-by-bit and, simultaneously, the contents of the polynomial divider 11a are read out bit-by-bit (illustrated in FIG. 2 by the ten outputs output from the polynomial divider corresponding to each bit of the 10-bit syndromes). Following the polynomial divider 11a is an error pattern recognizer 14a (e.g., five input NAND gate). The error pattern recognizer 14a is arranged so that if the bits are correct it outputs a '0', and if a corrupted bit is detected the output is a '1'. From this output the decoder knows that the false bit must be inverted to perform the error correction.

EC3) When all ten bits have been checked in this manner the polynomial divider 11a and the data register 10a are reset and the cycle is repeated for the next incoming block.

In the before-mentioned Radio Band Data System (RBDS) five offset words have been specified, which are A, B, C, D (as in the RDS) and E. The method for performing the error correction coding with these offset words differs from the method performed in the RDS, in that in the RBDS a constantly circulating sequence of the offset words is not created. The first four offset words A, B, C, and D are specified to always occur in succession, but after D either a new sequence of the first four words (A,B,C,D) can occur, or a set of n times four (n*4) offset words E can occur, where n is an integer equal to or greater than one. The sequence of the offset words used in the RBDS may therefore be, for example,

A,B,C,D, A,B,C,D, A,B,C,D, E,E,E,E, A,B,C,D, E,E,E,E, E,E,E,E, A,B,C,D . . .

In this example n=1 for the first occurrence of the offset word E, while for the second occurrence of the offset word E n=2.

When performing error correction decoding in the receiver of the RBDS the decoder must detect whether the offset word following offset word D is the word A or E. As such, the specified method of performing the error correction decoding in the RDS (which employs only the offset words A–D) cannot be used in the RBDS.

It can thus be appreciated that as a consequence of the difference in the sequences of the offset words between the RDS and the RBDS, it is necessary to use a different error correction decoder in a RDS receiver than in a RBDS receiver. This requirement thus complicates the task of providing a single receiver for use in those regions that may use the RDS (e.g., Europe), and those regions that may use the RBDS (e.g., the United States).

It is thus an object of this invention to provide a method for performing error correction decoding which can be used in both the Radio Data System and the Radio Band Data System.

It is a further object of this invention to provide an error correction decoder which can be used in both the Radio Data System and the Radio Band Data System.

SUMMARY OF THE INVENTION

The foregoing and other problems are overcome and the objects of the invention are realized by a method, and by apparatus for accomplishing the method, that takes into consideration two different techniques of using offset words in error correction coding by subtracting the offset word in a parallel mode from a calculated syndrome, i.e., after the syndrome calculation has been performed. In the error correction decoder the entire incoming block (26 bits) is read into the polynomial divider at one time. The invention thus provides the opportunity to operate the receiver using the offset words A, B, C, and D in the RDS or the offset words A, B, C, D, and E in the RBDS.

In accordance with an error correction decoder of this invention the decoder is arranged with a parallel-bit output offset counter coupled to the polynomial divider for subtracting the offset words in parallel from the calculated syndromes. The polynomial divider is further operated at a higher clock frequency when making a determination if a received incoming data block is encoded with an A or an E offset word.

A method for use in a receiver for the Radio Data System and/or the Radio Band Data System for performing error correction decoding includes the following steps: (a) receiving a coded data block having error correction coded bits, which have been coded with one of a set of predetermined data words; (b) processing the coded bits with a mathematical function; (c) detecting the processed bits to determine which data word the coded bits have been coded with; and (d) as a result of the step of detecting, further processing the processed bits with one of a predetermined set of data words for obtaining correct decoding.

BRIEF DESCRIPTION OF THE DRAWINGS

The above set forth and other features of the invention are made more apparent in the ensuing Detailed Description of the Invention when read in conjunction with the attached Drawings, wherein:

FIG. 4 is a more detailed block diagram of an error correction decoder suitable for practicing the invention;

DETAILED DESCRIPTION OF THE INVENTION

Figure 5:
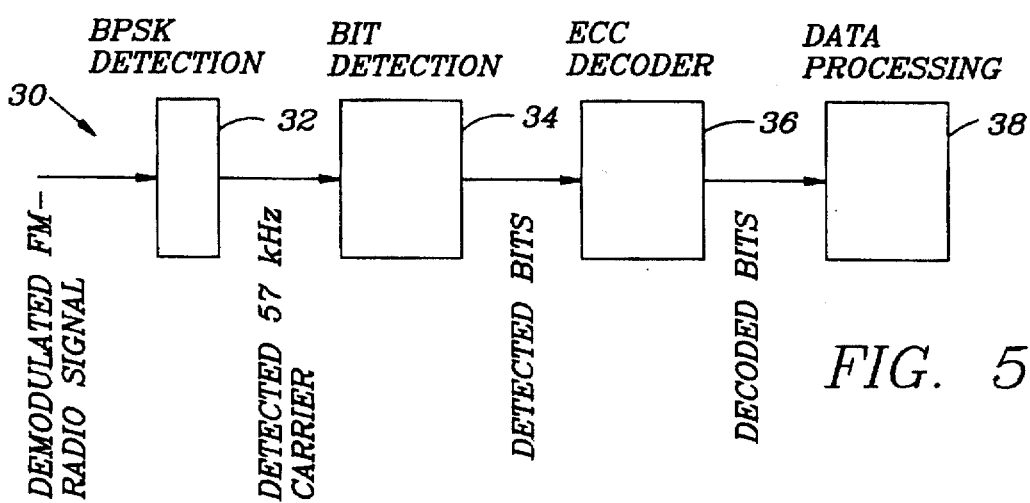
FIG. 5 is a simplified block diagram of a portion of an RDS/RBDS receiver.

Reference is first made to FIG. 5 for showing a simplified block diagram of a portion of an RDS/RBDS receiver 30 that is suitable for practicing the invention. In block 32 an FM-demodulated signal having a 57 kHz subcarrier is detected, using conventional techniques, to a BPSK signal with a 57 kHz band pass filter and a 57 kHz phase locked loop. In block 34 the BPSK signal, with baud rate 1187.5 Hz, is detected to bits with a conventional bit detector comprised of, by example, a low pass filter and a phase locked loop. In block 36 an RDS/RBDS error correction decoder is used to correct the possible errors which have occurred in the transmission channel, and to lock in RDS/RBDS offset synchronization. The present invention resides in the error correction decoder of block 36. In block 38 the corrected bits are processed as desired to manipulate the received data for driving displays, synthesizers, etc.

Figure 3:
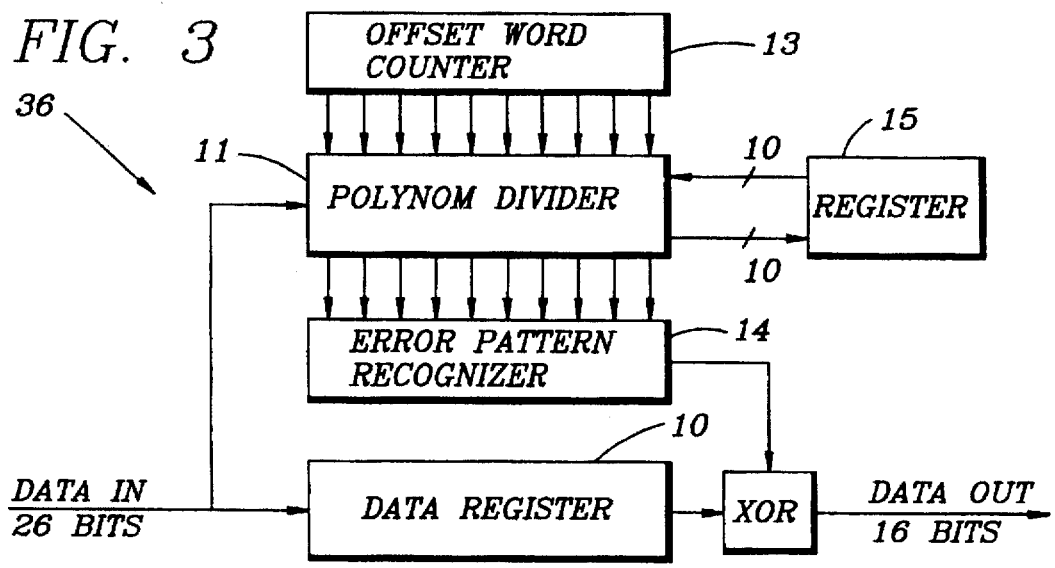
FIG. 3 is a block diagram of an error correction decoder suitable for practicing the invention.

Reference is made to FIG. 3 which shows a general block diagram of an error correction decoder (block 36 of FIG. 5) suitable for practicing this invention. A method for performing error correction decoding according to the invention is described subsequently. It is noted that the initial block synchronization can be accomplished in a manner that is similar to the conventional approaches discussed previously.

Thus, for block synchronization the following steps are performed.

Figure 1:
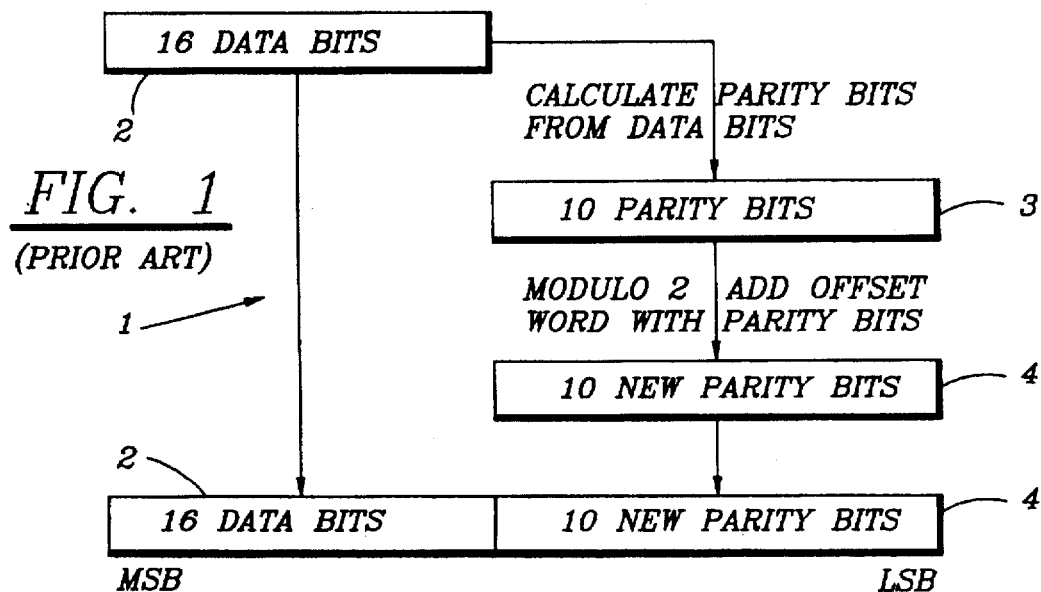
FIG. 1 is a diagram showing the general structure of a bit coded data block for the RDS/RBDS systems.

IS1) Incoming bits 1 (see FIG. 1) are read into the data register 10, which takes in 26 bits (and which for example can be implemented as a shift register).

IS2) The bits fed into the data register 10 are also fed into the polynomial divider 11 (which may be implemented as a shift register) in which the received data block (data word) is divided with the generator polynomial g(x). From this division the polynomial divider 11 provides a syndrome as an output. The syndrome is checked to determine if the output of the polynomial divider 11 is equal to any of the predetermined syndromes $S_A$–$S_D$ specified in the RDS specification.

IS3) If the output of the polynomial divider is equal to any of the syndromes $S_A$ to $S_D$, then block synchronization is achieved, otherwise a new bit is read into the data register 10 and the steps IS2) and IS3) are repeated until synchronization is achieved.

For error correction decoding the different offset word sequences of the RDS and the RBDS must be considered. In accordance with an aspect of this invention, after an occurrence of offset word D a check is made to determine whether the incoming block has been modulo-two added with the offset words A or E. If the syndrome of the incoming block is the offset word A syndrome, it is indicated that the following blocks have been modulo-two added with offset words B, C, and D in this order. Alternatively, if the incoming block has been modulo-two added with offset word E, it is indicated that (at least) the next three blocks have been modulo-two added with offset word E. It can thus be seen that performing an offset check on the incoming blocks need only be done for every fourth block (after an occurrence of offset word D or after an occurrence of a fourth repeat of offset word E), and for the other incoming data blocks the additional steps required to perform this check are unnecessary.

Figure 2:
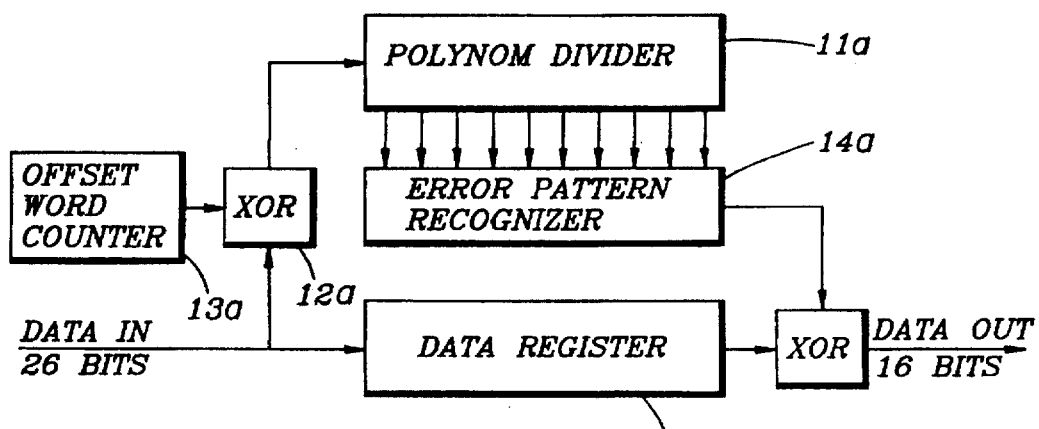
FIG. 2 is a block diagram of a conventional error correction decoder for the RDS system.

For a method of error correction decoding in accordance with this invention, the following steps are performed. It should be noted that one significant distinction between the error correction decoding of this invention and the prior art is that the offset word is subtracted in parallel from the calculated syndrome, while in the conventional approach (FIG. 2) the offset word is subtracted in a serial mode before syndrome calculation.

IEC1) The polynomial divider 11 is reset.

IEC2) The entire incoming block, i.e. 26 bits, is clocked into the polynomial divider 11 while the 16 most significant bits of the incoming block, i.e. the data bits, are clocked into the data register 10. This is done in serial bit-by-bit at a first clock rate equal to the bit rate frequency of the incoming bits (e.g., 1187.5 Hz). The polynomial divider 11 performs division by the generator polynomial g(x) and, optionally, a pre-multiplication with a pre-multiplication polynomial r(x). Pre-multiplication is preferably used when the 26-bit blocks are read into polynomial divider 11, in that the code used in the RDS/RBDS is a shortened ECC from the original code. The pre-multiplication enables the shortened 26-bit block to be treated as if it were the original (unshortened) block. The use of pre-multiplication is a known technique for use with shortened BCH codes.

IEC3) The basic clock frequency of the error correction decoder 36 is then changed (increased) in order to correct an error before the next bit is input. The clock frequency is increased by an amount to enable the correction of errors in the block within one bit time. The error correction is preferably done within one bit time otherwise a buffer is required for the incoming data. The new clock frequency is selected as a function of the number of operations which must be done within the one bit time, and as a function of the available clock frequencies within the unit (i.e., it is preferable to use an existing frequency rather than generate a frequency specifically for this function).

IEC4) The syndrome (the 10 least significant bits resulting from the division by the polynomial divider 11) is saved in a register 15 for further use.

IEC5) The polynomial divider 11 is clocked 26 times.

IEC6) After clocking the polynomial divider 11 the syndrome of the block in the polynomial divider 11 is checked. If the syndrome is 00H (zero) then it is indicated that the received block has been modulo-two added with offset word E, and also that at least the next three received blocks will also be coded with the offset word E. If the syndrome is not equal to 00H it is assumed that the received block has been modulo-two added with offset word A, and that at least the next three received blocks will be coded with offset words B, C and D, respectively. The operation of step IEC6 is now explained in greater detail.

Figure 6:
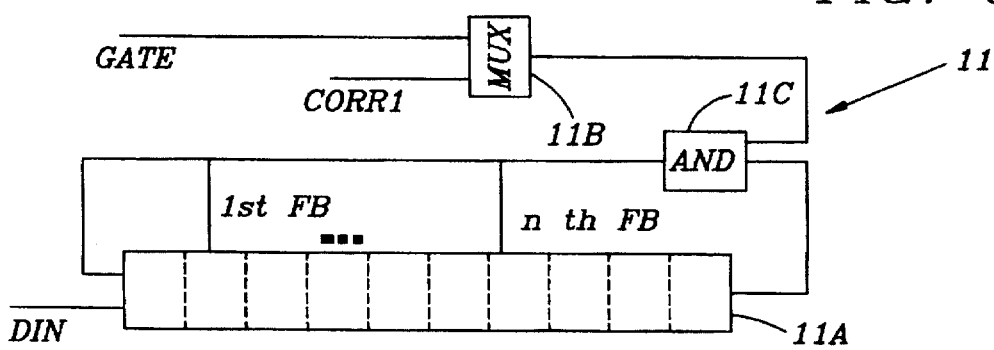
FIG. 6 is a block diagram that shows in greater detail the construction of the polynomial divider of FIGS. 3 and 4.

As is shown in FIG. 6, the polynomial divider 11 is preferably implemented as a plurality of flip/flops (FFs) configured as a feedback shift register 11a. The positions of the feedback (FB) inputs are set by the generator polynomial, and XORs in the shift register 11a of the polynomial divider 11 are provided for generating the exact polynomial divide. On those FFs where a feedback input is placed the feedback input signal is XORed with the data output from the previous FF. While the 26-bit (data+parity) word (Din) is read into the polynomial divider 11 a MUX 11b passes a GATE signal to an AND gate 11c, with the GATE signal being set to '1'. The polynomial divider 11 is set to the error correcting mode when the MUX 11b enables a Corr1 signal to pass to the AND gate 11c. The Corr1 signal is the output of error pattern recognizer 14 of FIG. 3. The parallel modulo 2 summing/parallel loading is done separately to each FF of the shift register 11a, and the associated logic is not illustrated in FIG. 6.

After the first 16 clock cycles the new syndrome is calculated and the next 10 clock cycles are then employed for determining if all errors are detectable/correctable. Thus, after 26 clock cycles the polynomial divider 11 contains information that indicates if the ECC procedure was successful.

The polynomial divider 11 is then clocked with the faster clock and the content of polynomial divider is recirculated in the error correction mode to perform error correction and detection.

It is pointed out that the value of code word E is 000H, and its syndrome is also 000H. In the normal case a code word is modulo 2 added with the syndrome of the polynomial divider 11 after 26 clock cycles, and the next 16 clock cycles make the error correction. However, because the syndrome of code word E is 000H, if it is modulo 2 added to some word the resulting sum is exactly equal to the original word. As a result, in practice the modulo 2 add operation need not be performed, and the presence of the code word E is assumed if the content of polynomial divider 11 is 000H after 26 clock cycles.

IEC7) The polynomial divider 11 is reset.

IEC8) The pre-calculated syndrome is input, in parallel, to the polynomial divider 11 from the register 15.

IEC9) The appropriate offset word (A, B, C, D, or E) is subtracted from the pre-calculated syndrome by clocking the polynomial divider 11 once. Since synchronization has been achieved (and the check of step IEC6 has been performed for every fourth block) the decoder 36 has determined the correct offset word. The offset words are counted with the offset word counter 13 in order to keep track of which offset word is being used. For this purpose a 2-bit counter may be used.

IEC10) Any existing errors are corrected by clocking the polynomial divider 11 and the data register 10. The contents of the data register 10 are output bit-by-bit and simultaneously the contents of the polynomial divider 11 are output bit-by-bit. The error pattern recognizer 14 (e.g., a five input NAND gate) operates as described previously so that if the bits are correct a '0' is output, and if a corrupted bit occurs the output is a '1'. From this the decoder 36 determines that the false bit has to be inverted.

IEC11) The syndrome of the polynomial divider 11 is checked to determine if the syndrome is 000H. If it is, the error correction decoder 36 has corrected all errors that possibly existed in the incoming block. If the syndrome does not equal to 000H, it is indicated that there has been an error in the error correction process.

IEC12) The offset word counter 13 is incremented to point to the next offset word for the next incoming block.

IEC15) The polynomial divider is reset in preparation for receiving in the next incoming block.

IEC16) The clock frequency of the error correction decoder is changed back to the incoming bit rate frequency, and the polynomial divider 11 is set to the read mode to wait until the next bit occurs.

After step IEC6 is performed for every fourth block, i.e., for the next block after the previous block was a modulo-two added block, then for the three following incoming blocks steps IEC4 to IEC8 can be bypassed so that the decoder 36 only performs steps IEC1 to IEC3 and IEC9 to IEC16. That is, the decoder 36 functions in the RDS mode.

FIG. 4 shows a more detailed block diagram of the error correction decoder 36 of FIGS. 3 and 5. The error correction decoder 36 includes the 16-bit shift register 10 and the polynomial divider 11 (which can be implemented as a shift register as in FIG. 6), the offset counter 13 for counting the offset words, and the 10-bit parallel register 15 for storing the calculated syndromes. The decoder 36 further includes an offset generator 16 which is responsive to the output of the counter 13 for generating the RDS and RBDS offset words A to E for performing subtraction of the offset words from the calculated syndromes. The offset generator 16 can be implemented as a memory device that stores the offset words A to E and that is addressed by the counter 13.

The incoming data block is input at input DIN which is connected to both the polynomial divider 11 and the 16-bit data register (shift register) 10. The 16 most significant bits of the incoming block are clocked into the data register 10 and all 26 bits are clocked into the polynomial divider 11. The offset counter 13 indicates which offset word is appropriate for the block being processed. After the subtraction the mode of the polynomial divider 11 is switched to an error correcting mode and both the polynomial divider 11 and the data register 10 are clocked 16 times to provide the data bits, via XOR 20, at the output OUT of the decoder 36.

10-bit wide parallel buses are arranged from the offset generator 16 and from the parallel register 15 to a two-input offset multiplexer (OFFMUX) 17 through which either an offset word or a stored syndrome is applied to the polynomial divider 11. At the output of the polynomial divider 11 a comparator 18 compares the syndromes output from the polynomial divider 11 to determine if all errors have been corrected. The output DATAOK of the comparator 18 indicates this condition when the syndrome output from the polynomial divider 11 is equal to 000H (after being clocked 26 times). A error counter (ERRCOUN) 19 at the output of the polynomial divider 11 counts a number of errors that occur in one block. The counter 19 provides as an output (ERRCOU) the number of corrected bits in the block. The exclusive-OR gate 20 selects the output bit from the polynomial divider 11 or from the 16-bit register 10, whereby when clocking both the data register 10 and the polynomial divider 11 sixteen times the 16 most significant bits of the block are presented to the output of the decoder 36.

The decoder includes a timing control circuit 21 having a data clock input DCLK, an input control signal MBS that indicates whether the decoder is functioning in the RDS or RBDS modes, wherein the control signal MBS has the value '0' for indicating RDS and '1' for indicating RBDS. The timing control circuit 21 also has as inputs a 3.648 MHz clock signal (CLK), and a reset input (RST). Timing control circuit 21 provides control signals indicated generally as 21a and a synchronizing clock signal OUTCLK to a next circuit (e.g., the processor 38) connected to the output of the decoder 36. The signal OUTCLK is used by the next circuit for clocking in the data bits appearing at the OUT terminal.

While the invention has been particularly shown and described with respect to a preferred embodiment thereof, it will be understood by those skilled in the art that changes in form and details may be made therein without departing from the scope and spirit of the invention.

What is claimed is:

1. A data decoder for use in a receiver, comprising:
   a receiver for receiving a coded data block that includes error correction coded bits which have been coded with one of a first or a predetermined data word associated with a first data transmission system second predetermined data word associated with a second data transmission system;
   a first circuit block for processing said coded bits with a predetermined mathematical function;
   a second circuit block for detecting from the processed bits which one of the first or second predetermined data words the coded bits have been coded with; and
   said first circuit block is further responsive to an operation of said second circuit block, for further processing the processed bits for obtaining correct decoding of the coded data block and for processing subsequently received coded data blocks with one of a set of first predetermined data words and a set of second predetermined data words.

2. A decoder as set forth in claim 1 wherein said first circuit block includes a divider for dividing the coded bits with a predetermined generator polynomial to generate a syndrome.

3. A decoder as set forth in claim 2 and further comprising:
   a data storage device for storing the syndrome;
   a subtractor for subtracting a selected one of the predetermined code words from the syndrome to form an error correction word; and
   an error corrector for error correcting the coded data bits with the error correction word.

4. A data decoder for use in a receiver, comprising:
   a receiver for receiving a coded data block that includes error correction coded bits which have been coded with one of a first or second predetermined data word;
   a first circuit block for processing said coded bits with a predetermined mathematical function;
   a second circuit block for detecting from the processed bits which one of the first or second predetermined data words the coded bits have been coded with; and
   said first circuit block is further responsive to an operation of said second circuit block, for further processing the processed bits for obtaining correct decoding of the coded data block and for processing subsequently received coded data blocks with one of a set of first predetermined data words and a set of second predetermined data words;
   wherein said first set of predetermined data words is comprised of four different data words A, B, C, and D, and wherein said second set of predetermined data words is comprised of multiple repeats of a data word E.

5. A decoder as set forth in claim 4 wherein said coded data block is comprised of 16 data bits and 10 parity bits.

6. A decoder as set forth in claim 4 wherein said first circuit block and said second circuit block are operated to examine every fourth coded data block to determine if the coded data block has been coded with the data word A or the data word E.

7. A decoder as set forth in claim 1 wherein said first circuit block is comprised of a feedback shift register operable for dividing the coded bits with a predetermined generator polynomial to generate a syndrome, wherein the coded bits are shifted into the feedback shift register with a bit clock having a first frequency and a first period, and wherein said feedback shift register is periodically operated at a second, higher clock frequency for determining if the coded bits are equal to one of the first or second predetermined data words within an interval time that is equal to or less than the first period.

8. A receiver for receiving a frequency modulated signal having a superimposed carrier for conveying blocks of digital information, each block of digital information being encoded with one of a plurality of code words belonging to a first sequence A, B, C, D, A, B, C, D, A, ... or belonging to a second sequence A, B, C, D, (4n*E), A, B, C, D, ..., where n is an integer, the receiver comprising:
   an input circuit block for extracting and detecting the digital information from the superimposed carrier to generate a detected encoded data block;
   a first signal processor block for processing said detected encoded data block with a predetermined mathematical function;
   a second signal processor block for determining from the processed encoded data block whether the encoded data block has been encoded with an A code word or with an E code word; and
   said first signal processor block is responsive to an operation of said determining means, for further processing the encoded data block so as to at least detect if there are any errors present within the encoded data block.

9. A receiver as set forth in claim 8 wherein said first signal processor block is comprised of a divider for dividing the detected encoded data block with a predetermined generator polynomial to generate a syndrome, and wherein said second signal processor block is responsive to the generated syndrome for determining whether the detected encoded data block has been encoded with an A code word or with an E code word.

10. A receiver as set forth in claim 9 and further comprising:

means for storing the generated syndrome;

means for subtracting a selected one of the code words from the syndrome to form an error correction word; and means for error correcting, if necessary, the coded data block with the error correction word.

11. A receiver as set forth in claim 8 wherein each detected encoded data block is comprised of 16 data bits and 10 parity bits.

12. A receiver as set forth in claim 8 wherein said first signal processor block and said second signal processor block are operated to examine only every fourth detected encoded data block to determine if the detected encoded data block has been encoded with the data word A or with the data word E.

13. A receiver as set forth in claim 8 wherein said first signal processor block is comprised of a feedback shift register operable for dividing the detected encoded data block with a predetermined generator polynomial to generate a syndrome, wherein the detected encoded data block is shifted into the feedback shift register with a bit clock having a first frequency and a first period, and wherein said feedback shift register is periodically operated at a second, higher clock frequency for determining, within an interval time that is equal to or less than the first period, if the detected encoded data block has been encoded with one of the first or the second predetermined data words.

* * * * *

UNITED STATES PATENT AND TRADEMARK OFFICE
CERTIFICATE OF CORRECTION

PATENT NO. : 5,745,503
DATED : April 28, 1998
INVENTOR(S) : Kuusinen

It is certified that error appears in the above-identified patent and that said Letters Patent is hereby corrected as shown below:

In the Claims:

Claim 1: Col. 9, lines 35-40.

The text at lines 35-40 should read as follows:

--a receiver for receiving a coded data block that includes error correction coded bits which have been coded with one of a first predetermined data word associated with a first data transmission system or a second predetermined data word associated with a second data transmission system;--

Signed and Sealed this

First Day of September, 1998

Attest:

BRUCE LEHMAN

Attesting Officer

Commissioner of Patents and Trademarks